(12) United States Patent
Kishiro et al.

(10) Patent No.: US 7,947,514 B2
(45) Date of Patent: May 24, 2011

(54) SEMICONDUCTOR DEVICE PRODUCTION PROCESS

(75) Inventors: Koichi Kishiro, Tokyo (JP); Kouji Nasu, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 576 days.

(21) Appl. No.: 12/076,219

(22) Filed: Mar. 14, 2008

(65) Prior Publication Data

US 2008/0241976 A1 Oct. 2, 2008

(30) Foreign Application Priority Data

Mar. 29, 2007 (JP) ................................. 2007-087400

(51) Int. Cl.
*H01L 21/66* (2006.01)
(52) U.S. Cl. ..................... 438/14; 438/17; 257/E21.526; 257/E21.529
(58) Field of Classification Search .................... 438/14, 438/17; 257/E21.526, E21.529
See application file for complete search history.

(56) References Cited

U.S. PATENT DOCUMENTS 6,800,562 B1 * 10/2004 Cusson et al. ................ 438/714

FOREIGN PATENT DOCUMENTS

| JP | 2003-060120 | 2/2003 |
| JP | 2006-319203 | 11/2006 |
| JP | 2006-319204 | 11/2006 |

OTHER PUBLICATIONS

Machine Translation of JP-2006-319204.*

* cited by examiner

*Primary Examiner* — Asok K Sarkar
*Assistant Examiner* — Julia Slutsker
(74) *Attorney, Agent, or Firm* — Rabin & Berdo, PC

(57) ABSTRACT

A semiconductor device production process includes forming, on a prepared SOI wafer, semiconductor functional devices and substrate contacts. The substrate contacts connect to a support substrate of the SOI wafer. The semiconductor device production process also includes forming a pattern that connects the substrate contacts to external connection pads formed on the semiconductor functional devices such that the external connection pads are not connected to each other. The semiconductor device production process also includes measuring conductivity between the external connection pads.

11 Claims, 13 Drawing Sheets

SEMICONDUCTOR DEVICE PRODUCTION PROCESS

BACKGROUND OF THE INVENTION

1. Field of the Invention

The present invention relates to a semiconductor device production process, and more particularly, to a production process that includes measurement of conductivity of a semiconductor device having an SOI structure.

2. Description of the Related Art

A technology referred to as SOI technology is currently used in semiconductor devices for realizing further decreases in power consumption and faster operation. When fabricating a semiconductor device using SOI technology, a semiconductor functional device is produced from a particular type of wafer, which is referred to as an SOI wafer.

An SOI wafer is a wafer having a structure in which a semiconductor layer serving as a device forming region is separated from a silicon substrate (hereinafter referred to as a support substrate) by a first insulating layer in the form of a thick silicon oxide film (hereinafter referred to as a buried oxide film). In the case of forming a semiconductor functional device on a semiconductor layer of an SOI wafer, silicon serving as a channel region and a diffusion region is completely insulated from the support substrate by the buried oxide film.

If a semiconductor functional device is formed on a semiconductor layer of an SOI wafer, the characteristics of the semiconductor functional device ends up fluctuating due to accumulation of a hot carrier in the channel region of the functional semiconductor device. The hot carrier is generated when the semiconductor functional device is turned on. In order to suppress these fluctuations, it is necessary to stabilize the operation of the semiconductor functional device by fixing the electrical potential of the channel region. A known method for fixing the electrical potential of a semiconductor functional device includes forming contact holes that penetrate the buried oxide film during the waferprocess, and embedding an electrically conductive substance in the contact holes, thereby connecting the support substrate and semiconductor functional device with the wafer surface.

In this method, since the support substrate is connected with the semiconductor functional device during the wafer process, charge generated during CVD and etching treatment or during electrostatic chuck operation ends up being input to the semiconductor functional device via the electrically conductive substance embedded in the contact holes. The charge is generated by bias of a stage applied to the support substrate during CVD and etching treatment, and bias of an electrostatic chuck applied for adsorbing the SOI wafer to the stage. Damage resulting from this input of charge that occurs during the wafer process (referred to as process-induced damage, or PID) has the risk of causing deterioration of the characteristics of the semiconductor functional device as well as the gate oxide film.

A countermeasure for this problem is known in the art. The influences of PID on semiconductor functional devices can be prevented by eliminating connection between the semiconductor functional device and support substrate during the wafer process (see Japanese Patent Application Kokai (Laid-open) No. 2006-319203 and Japanese Patent Application Kokai No. 2006-319204).

A semiconductor device disclosed in Japanese Patent Application Kokai No. 2006-319203 and Japanese Patent Application Kokai No. 2006-319204 includes an SOI wafer, an insulating layer on the SOI wafer, and an external connection pad on the insulating layer. The SOI wafer has a support substrate, buried oxide film and semiconductor layer. Substrate contacts are provided that pass through the buried oxide layer, semiconductor layer and insulating layer so as to connect the external connection pad with the support substrate. A semiconductor functional device is connected with an internal circuit pad provided on the insulating layer without being connected to the support substrate.

The use of the semiconductor device described in Japanese Patent Application Kokai No. 2006-319203 and Japanese Patent Application Kokai No. 2006-319204 makes it possible to connect the support substrate with the functional semiconductor device because a substrate connection pad on the insulating layer is connected with an internal circuit pad by wires, bonding or the like after the wafer process.

However, since the support substrate is not connected with the semiconductor functional device during the wafer process, the connection status from the external connection pad to the support substrate (to be referred to as a pin check) cannot be confirmed during probing in the wafer status. This is because measurement of conductivity between the external connection pad connected to the support substrate and internal circuit pad of the semiconductor functional device is not possible during probing in the wafer status. The pin check cannot be carried out unless the support substrate is connected to the semiconductor functional device. Work efficiency of the entire semiconductor device production process decreases since production proceeds to the next step without correcting or eliminating those devices which contain substrate contacts having defective electrical characteristics.

One approach for solving this problem includes carrying out a pin check between a prober stage and external connection pad by etching the back face of the SOI wafer and exposing the support substrate. However, since the potential for the stage potential can fluctuate depending on the status of the prober, it is difficult to accurately carry out a pin check between the stage and external connection pad.

SUMMARY OF THE INVENTION

An object of the present invention is to provide a semiconductor device production process capable of improving productivity in a semiconductor device production process by making it possible to confirm connection status between an external connection pad and support substrate in the state of a wafer.

According to one aspect of the present invention, there is provided a semiconductor device production process that includes a preparation step for preparing an SOI wafer. The SOI wafer includes a silicon support substrate, an oxide film formed on the silicon support substrate, and a semiconductor layer formed on the oxide film. The semiconductor device production process also includes a device formation step for forming a plurality of semiconductor functional devices in the semiconductor layer and forming a plurality of substrate contacts that extend to the silicon support substrate through the semiconductor layer and the oxide film. An insulating layer is provided on the semiconductor functional devices. The substrate contacts are associated with the semiconductor functional devices respectively. The semiconductor device production process also includes a pad formation step for forming a plurality of external connection pads on the insulating layer. The external connection pads are provided for the semiconductor functional devices respectively. The semiconductor device production process also includes a pattern formation step for forming a wiring pattern that connects the substrate contacts to the external connection pads but does not connect the external connection pads to each other. The semiconductor device production process also includes a basic inspection step for measuring conductivity between two or more external connection pads.

Since the connection status between external connection pads and support substrate is confirmed in a wafer state, defective products can be prevented from proceeding to the next step, thereby improving productivity of the semiconductor device production process.

If the measured conductivity is equal to or less than a predetermined value in the basic inspection step, the semiconductor device production process may further include an additional inspection step. In the additional inspection step, one of those external connection pads which have undergone the basic inspection step is replaced by another external connection pad, and conductivity between these external connection pads is measured.

The device formation step may include forming a wiring circuit that connects at least two of the substrate contacts, in the insulation layer.

The pattern formation step may include forming a plurality of first wiring patterns. Each first wiring pattern connects each external connection pad with a corresponding substrate contact.

The semiconductor device production process may further include a wiring step for forming a second wiring pattern that connects the external connection pads to a reference potential terminal following the basic inspection step or the additional inspection step. This wiring step may include connecting the semiconductor functional devices to the external connection pads.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Now, embodiments of the present invention will be described with reference to the attached drawings.

First Embodiment

Figure 1:
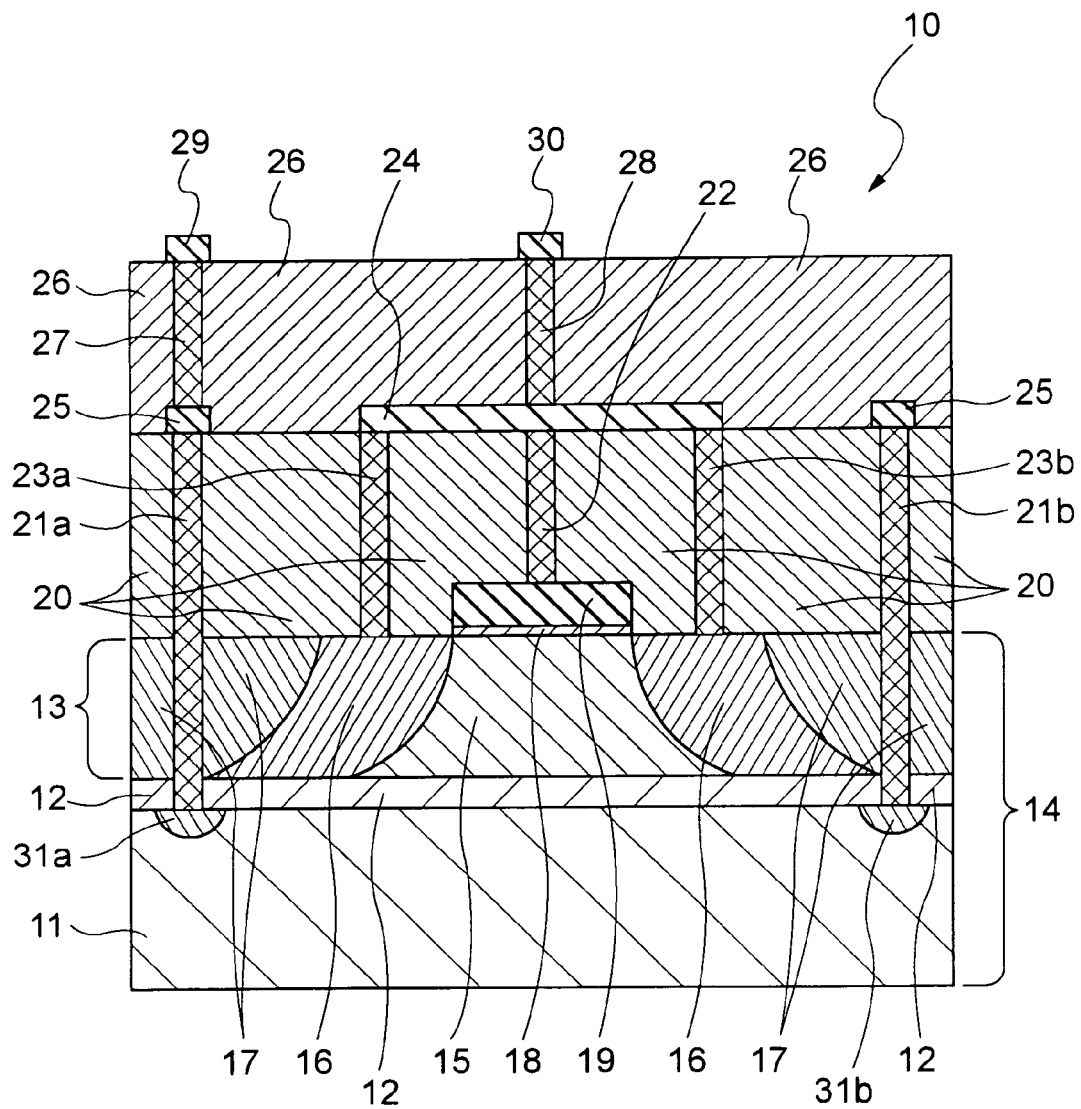
FIG. 1 is a cross-sectional view of a semiconductor device produced according to a first embodiment of the present invention.

Referring to FIG. 1, one example of a semiconductor device produced according to a first embodiment of the present invention will be described.

As shown in FIG. 1, a semiconductor device 10 has an SOI wafer 14 in which a semiconductor layer 13 is formed on a support substrate 11 made of silicon and the like with a buried oxide film 12 interposed therebetween. The semiconductor layer 13 has a channel region 15, a diffusion region 16 surrounding channel region 15, and a device isolation region 17 surrounding both the channel region 15 and diffusion region 16. A gate electrode 19 is formed on the channel region 15 on the semiconductor layer 13 with a gate insulation film 18 interposed therebetween.

A first insulating layer 20 is formed on the semiconductor layer 13 and gate electrode 19. Substrate contacts 21a and 21b that will be used for electrical connection with the support substrate 11 are formed passing through the first insulating layer 20, device isolation region 17 and oxide film 12. An internal circuit contact 22, which will be used for electrical connection with the gate electrode 19, is formed passing through the first insulating layer 20. Another internal circuit contacts 23a and 23b, which will be used for electrical connection with the diffusion region 16, are formed passing through the first insulating layer 20.

Internal circuit contact wiring 24 is formed on the first insulating layer 20. The internal circuit contact wire 24 forms a desired circuit by connecting the internal circuit contact 22 with the internal circuit contacts 23a and 23b. Substrate contact wiring 25 is formed on the first insulating layer 20. The substrate contact wiring 25 forms a desired circuit by connecting the substrate contact 21a with the substrate contact 21b. The internal circuit contact wiring 24 and substrate contact wire 25 are not connected with each other, but rather compose independent circuits.

A second insulating layer 26 is formed on the internal circuit contact wire 24, substrate contact wire 25 and first insulating layer 20. A substrate contact 27 that will be used for electrical connection with the substrate contact wire 25 is formed passing through the second insulating layer 26. An internal circuit contact 28 that will be used for electrical connection with the internal circuit contact wire 24 is formed passing through the second insulating layer 26. An external connection pad 29 and an internal circuit pad 30 are formed on the second insulating layer 26. The external circuit pad 29 is connected with the substrate contact 27 by a wiring pattern (will be described later). It should be noted that the internal circuit pad 30 may be formed on the internal circuit contact 28 so that it may also be connected with the internal circuit contact 28.

The external connection pad 29 is connected with contact implantation regions 31a and 31b by means of the substrate contacts 21a and 21b, substrate contact wire 25 and substrate contact 27. The contact implantation regions 31a and 31b are formed in the support substrate 11 for reducing resistance of the connections between the substrate contacts 21a and 21b and the support substrate 11. Thus, the external connection pad 29 can be used for electrical connection with the support substrate 11 through the substrate contacts 21a, 21b and 27 and contact wire 25 formed in the first insulating layer 20 and second insulating layer 26.

The channel region 15, diffusion region 16, device isolation region 17, gate insulation film 18, gate electrode 19, first insulating layer 20, second insulating layer 26, internal circuit contacts 22, 23a, 23b and 28, internal circuit contact wire 24 and internal circuit pad 30 are collectively referred to as a semiconductor functional device.

The following provides a detailed explanation of one example of a method of making the semiconductor device 10 with reference to FIGS. 2 to 5.

Figure 2:
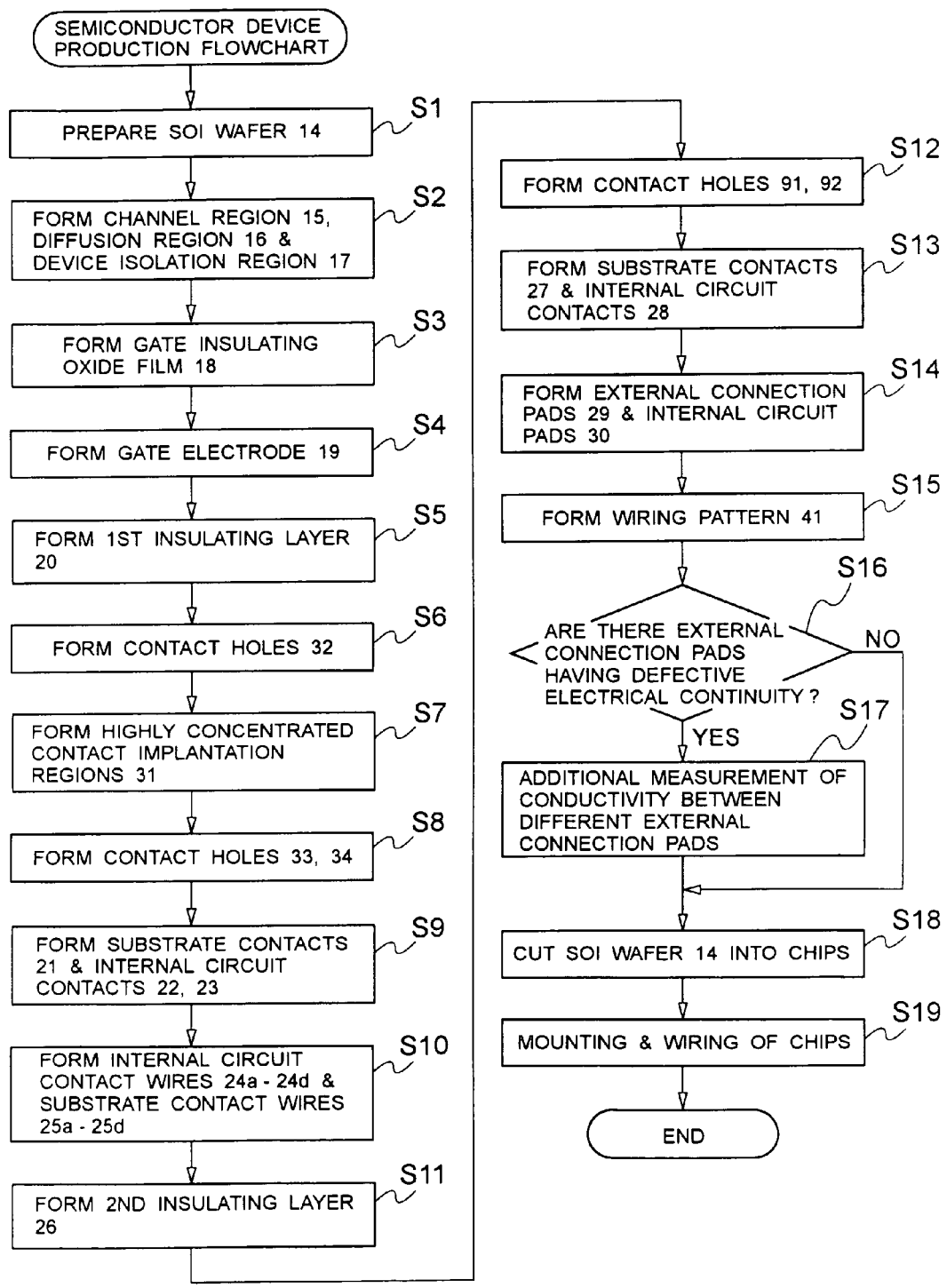
FIG. 2 is a flow chart of a semiconductor device production process in the first embodiment of the present invention.
Figure 3A:
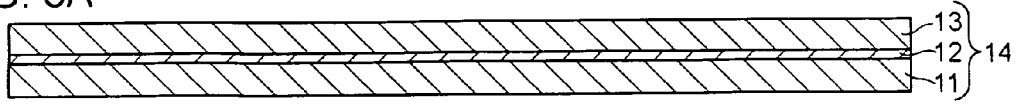
FIG. 3A to FIG. 3G is a series of cross-sectional views of a semiconductor device in the production process according to the first embodiment of the present invention.

First, the SOI wafer 14 is prepared in which the semiconductor layer 13 is formed on the support substrate 11 with the buried oxide film 12 interposed therebetween (Step S1 in FIG. 2). The structure of the SOI wafer 14 is shown in FIG. 3A.

Next, the channel region 15, diffusion region 16 and device isolation region 17 are formed on the semiconductor layer 13 using a known technology (Step S2). The device isolation region 17 may be formed using a technology such as local oxidation of silicon (LOCOS) or shallow trench isolation (STI). The diffusion region 16 may be formed by ion implantation or doping.

Figure 3B:
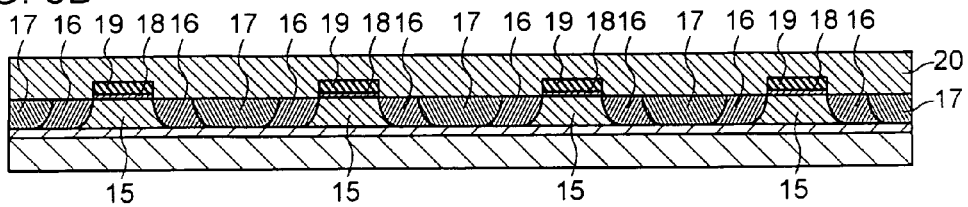

Subsequently, the gate insulating oxide film 18 is formed on the semiconductor layer 13 by, for example, thermal oxidation (Step S3). Then, polysilicon is deposited on the semiconductor layer 13 and gate insulating oxide film 18, and the gate electrode 19 is formed on the gate insulating film 18 by patterning the polysilicon with photolithography (Step S4). Subsequently, the first insulating layer 20 is formed on the semiconductor layer 13 and gate electrode 19 (Step S5). A cross-sectional view of the SOI wafer following formation of the first insulating layer 20 is shown in FIG. 3B.

Figure 3C:
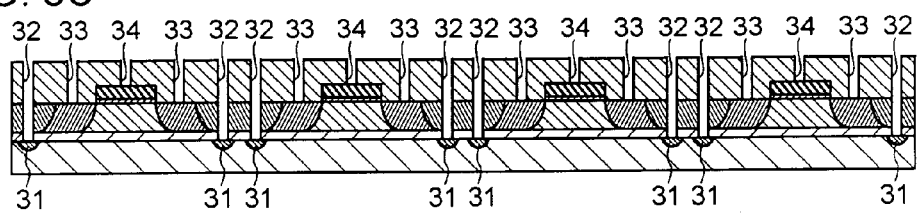

Next, a resist, for example, is coated on the first insulating layer 20, and contact holes 32 are formed that pass through the first insulating layer 20, device isolation region 17 and buried oxide film 12 using a known dry etching method and the like (Step S6). Subsequently, highly concentrated contact implantation regions 31 are formed in the support substrate 11 by carrying out contact implantation to reduce resistance of the connections between the support substrate 11 and substrate contacts (will be described) (Step S7). The concentration of impurities during contact implantation may be $1 \times 10^{20}$ to $1 \times 10^{21}$ ions/cm$^3$. The diameter of each contact hole 32 may be half the height of each contact hole 32 to allow ion species for forming the contact implantation region 31 to reach the support substrate 11. Subsequently, the contact holes 33 and 34 extending to the diffusion region 16 and gate electrode 19 are formed using the same method as that used to form the contact holes 32 (Step S8). A cross-sectional view of the SOI wafer following formation of the contact holes 32, 33 and 34 is illustrated in FIG. 3C.

Figure 3D:
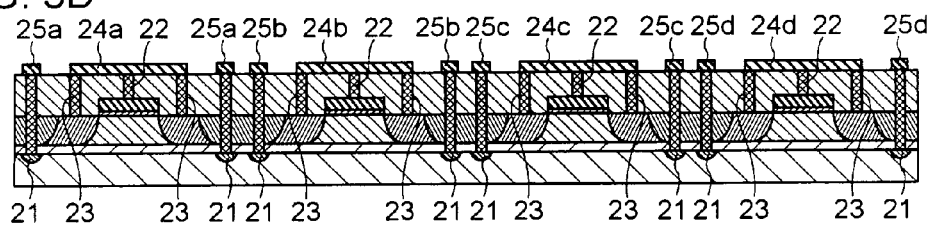

Next, tungsten and the like is grown inside the contact holes 32, 33 and 34 to form the substrate contacts 21 for electrical connection with the contact implantation regions 31, to form the internal circuit contacts 22 for electrical connection with the gate electrode 19, and to form internal circuit contacts 23 for electrical connection with the diffusion region 16 (Step S9). Excess tungsten may be removed by etching back. Subsequently, a metal film made of aluminum or aluminum alloy is deposited by a method such as sputtering on the first insulating layer 20, substrate contacts 21 and internal circuit contacts 22, and then the metal film is patterned in a desired manner by photolithography to form the internal circuit contact wires 24a to 24d and substrate contact wires 25a to 25d (Step S10). The internal circuit contact wires 24a to 24d may not be connected with each other, but may connect a single predetermined internal circuit contact 22 with a plurality of predetermined internal circuit contacts 23. The substrate contact wires 25a to 25d may not be connected with each other (namely, the internal circuit contact wires 24a are connected with each other, but the internal circuit contact wires 25a are not connected with the internal circuit contact wires 25b), but may connect a plurality of predetermined substrate contacts 21 with each other. Across-sectional view of the SOI substrate following formation of the internal circuit contact wires 24a to 24d and substrate contact wires 25a to 25d is shown in FIG. 3D.

Figure 3E:
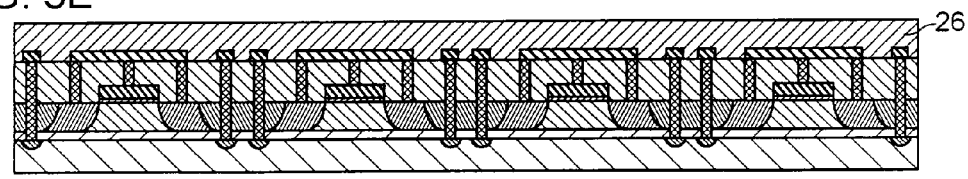

Next, a second insulating layer 26 is formed on the first insulating layer 20, internal circuit contact wires 24a to 24d, and substrate contact wires 25a to 25d (Step S11). A cross-sectional view of the SOI wafer following formation of the second insulating layer 26 is depicted in FIG. 3E. The second insulating layer 26 may also be deposited by chemical vapor deposition (CVD).

Figure 3F:
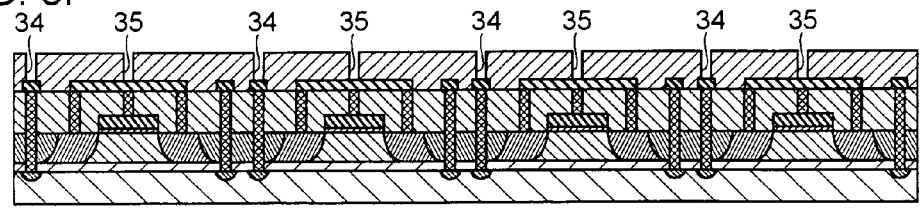

Next, contact holes 34 extending to the substrate contact wires 25a to 25d and contact holes 35 extending to the internal circuit contact wires 24a to 24d are formed by the same method as that used to form the contact holes 32, 33 and 34 (Step S12). A cross-sectional view of the SOI wafer following formation of these contact holes 34 and 35 is illustrated in FIG. 3F.

Figure 3G:
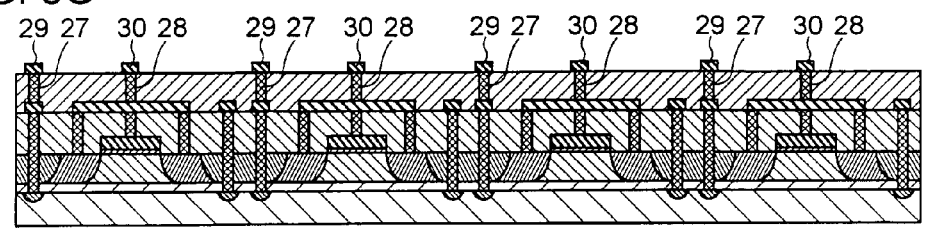

Next, substrate contacts 27 are formed in the contact holes 34 and the internal circuit contact wires 28 are formed in the contact holes 35 by growing tungsten and the like in the contact holes 34 and 35 (Step S13). Excess tungsten may be removed by etching back. Subsequently, external connection pads 29 are formed on the second insulating layer 26 and internal circuit pads 30 are formed on the internal circuit contact wires 28 (Step S14). Electrical continuity is maintained between the internal circuit pads 30 and internal circuit contact wires 28 since the internal circuit pads 30 are formed on the internal circuit contact wires 28. It should be noted that the internal circuit pads 30 may be formed on the second insulating layer 26 without being formed on the internal circuit contact wires 28. In this case, a wiring step may be carried out for connecting the internal circuit pads 30 with the internal circuit contact wires 28. A cross-sectional view of the SOI wafer following formation of the external connection pads 29 and internal circuit pads 30 is shown in FIG. 3G.

Figure 4A:
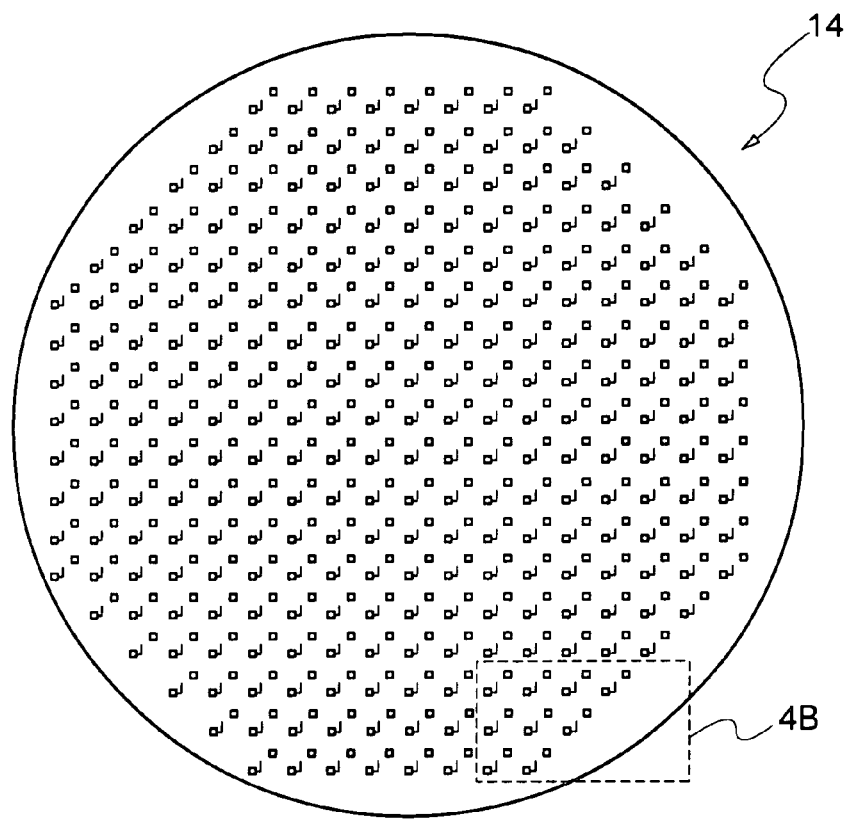
FIG. 4A is a front view of a semiconductor wafer produced according to the first embodiment of the present invention.
Figure 4B:
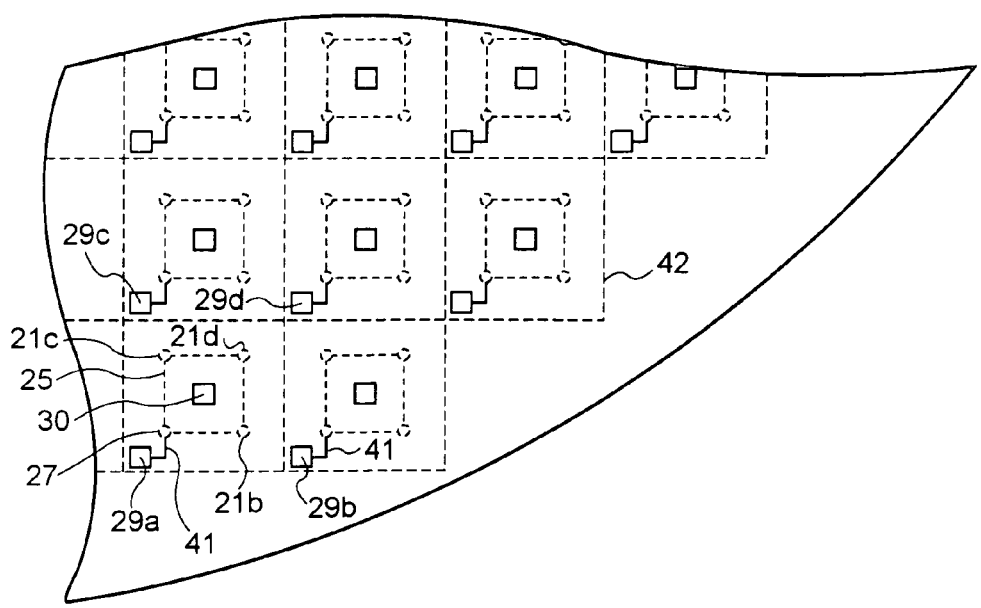
FIG. 4B is an enlarged view of the portion indicated with the broken line 4B in FIG. 4A.

Next, a wiring pattern 41 connected to the substrate contacts 27 is formed such that the corresponding external connection pads 29 formed on the second insulating layer 26 are not connected with each other (Step S15). A front view of the SOI wafer 14 following formation of the wiring pattern is shown in FIG. 4A. FIG. 4B shows an enlarged view of the portion indicated with the broken line 4B in FIG. 4A. As shown in FIG. 4B, the external connection pad 29a is connected to the substrate contact 27 by means of the wiring pattern 41. The substrate contact 27 is connected with the substrate contacts 21b, 21c and 21d by means of the substrate contact wires 25 within the insulating layer.

Next, the presence of external connection pads having defective electrical continuity is determined by measuring the conductivity between the external connection pads 29 formed on the second insulating layer 26 (Step S16). Measurement of conductivity may be carried out by measuring conductivity between each two adjacent external connection pads (e.g., the external connection pads 29a and 29b). Such two external connection pads are referred to as "pad pair." This conductivity measurement can be carried out simultaneously or in parallel for a plurality of pad pairs. If no pad pairs for which measured conductivity is equal to or less than a reference value (namely, the state in which electrical continuity is not maintained) are found, all the external connection pads 29 within the wafer are judged to be connected with the support substrate 11, and the process proceeds to Step S18. If any of the pad pairs for which measured conductivity is equal to or less than the reference value is detected, an additional measurement of conductivity is carried out for this defective pad pair (Step S17). This additional measurement of conductivity includes connecting one of the external connection pads judged to have good electrical continuity, which is confirmed in Step S16, with one of the external connection pads in the defective pad pair, and measuring the conductivity between these two external connection pads. This additional measurement of conductivity is also carried out for the other external connection pad in the defective pad pair. As a result, it is possible to determine which one (or both) of the external connection pads in the defective pad pair is really defective. The pairing of the external connection pads for measurement of conductivity can be easily carried out by a suitable program. The changing of a particular external connection pad in a particular pad pair can also be done easily using a common technology. Step S16 may be referred to as "basic inspection step."

The following will explains a detailed example of Steps S16 and S17. It should be assumed here that the external connection pads 29a and 29b in FIG. 4B defines a pair (pair A), and the external connection pads 29c and 29d define another pair (pair B). Conductivity between the two external connection pads is measured in parallel for the pad pairs A and B. It should also be assumed that the result of this conductivity measurement reveals that electrical continuity is not satisfactory in the pair A, but is satisfactory in the pair B. Next, the external connection pads 29a and 29c are paired (pair C), the external connection pads 29b and 29d are paired (pair D), and the electrical continuity between the two external connection pads is measured for the respective pad pairs C and D. If the electrical continuity is judged to be satisfactory in the pair C but not satisfactory in the pair D, then electrical continuity is judged to not be maintained by the external connection pad 29b only or it is determined that only the pad 29b is defective. Conversely, if the electrical continuity is judged to not be maintained in the pair C but maintained in the pair D, then electrical continuity is judged to not be maintained by external connection pad 29a only. If the electrical continuity is not maintained in both the pairs C and D, then electrical continuity is judged to not be maintained by both the external connection pads 29a and 29b. Thus, the measurement of conductivity makes it possible to determine which external connection pad(s) does not have satisfactory electrical continuity.

It should be noted that Step S17 may be applied to three or more external connection pads at a time. For example, which external connection pad(s) has defective electrical continuity is determined by applying the conductivity measurement of Step S17 to three external connection pads in parallel (three-way parallel measurement).

Next, the SOI wafer is cut into chips by dicing and the like in the same manner as ordinary semiconductor device production processes (Step S18). For example, the SOI wafer may be cut into chips along the broken lines 42 as shown in FIG. 4B.

Since the electrical continuity of the external connection pad 29 in each chip is checked in Steps S16 and S17 and the chip cutting along the lines 42 is carried out in Step S18, the presence of defective electrical continuity is already known for each chip when it is cut out. Chips having defective electrical continuity can be prevented from proceeding to the next step by removing those chips having external connection pads with defective electrical continuity.

Figure 5:
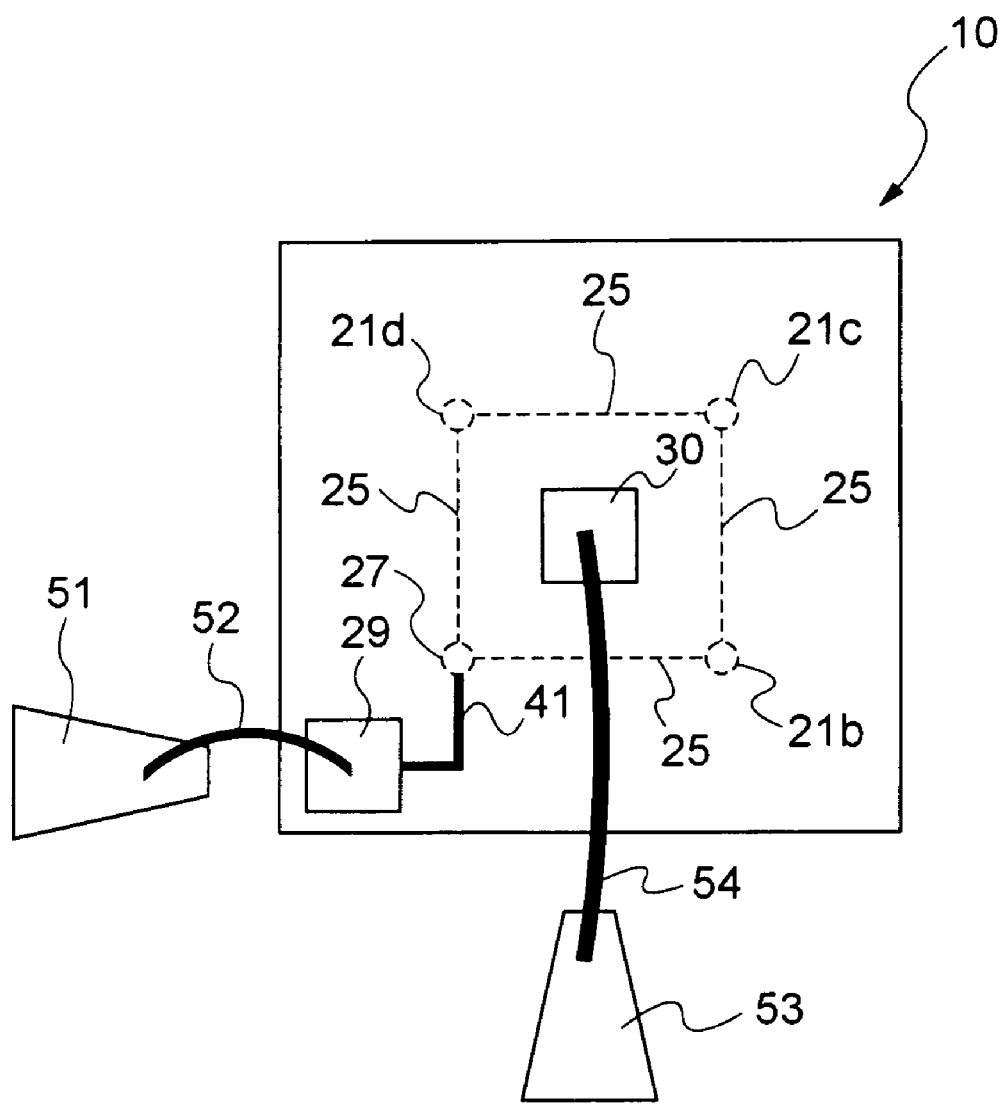
FIG. 5 schematically illustrates wiring in the semiconductor device according to the first embodiment of the present invention.

Next, the chips prepared in Step S18 are mounted and wired in a predetermined manner in a mounting area (not shown) of a semiconductor device (Step S19). As shown in FIG. 5, the predetermined wiring may connect an external connection pad 29 with an external terminal 51 via a wire 52, and connect an internal circuit pad 30 with an external terminal 53 via a wire 54. As a result of such wiring, the external connection pad 29 and internal circuit pad 30 are independently connected to the outside. It should be noted that the external connection pad 29 and internal circuit pad 30 may be connected to the external terminals 51 and 53 by wire bonding, respectively.

Next, an example of the layout of the substrate contact 27 produced according to the above-described semiconductor device production process will be described with reference to FIG. 6.

Figure 6:
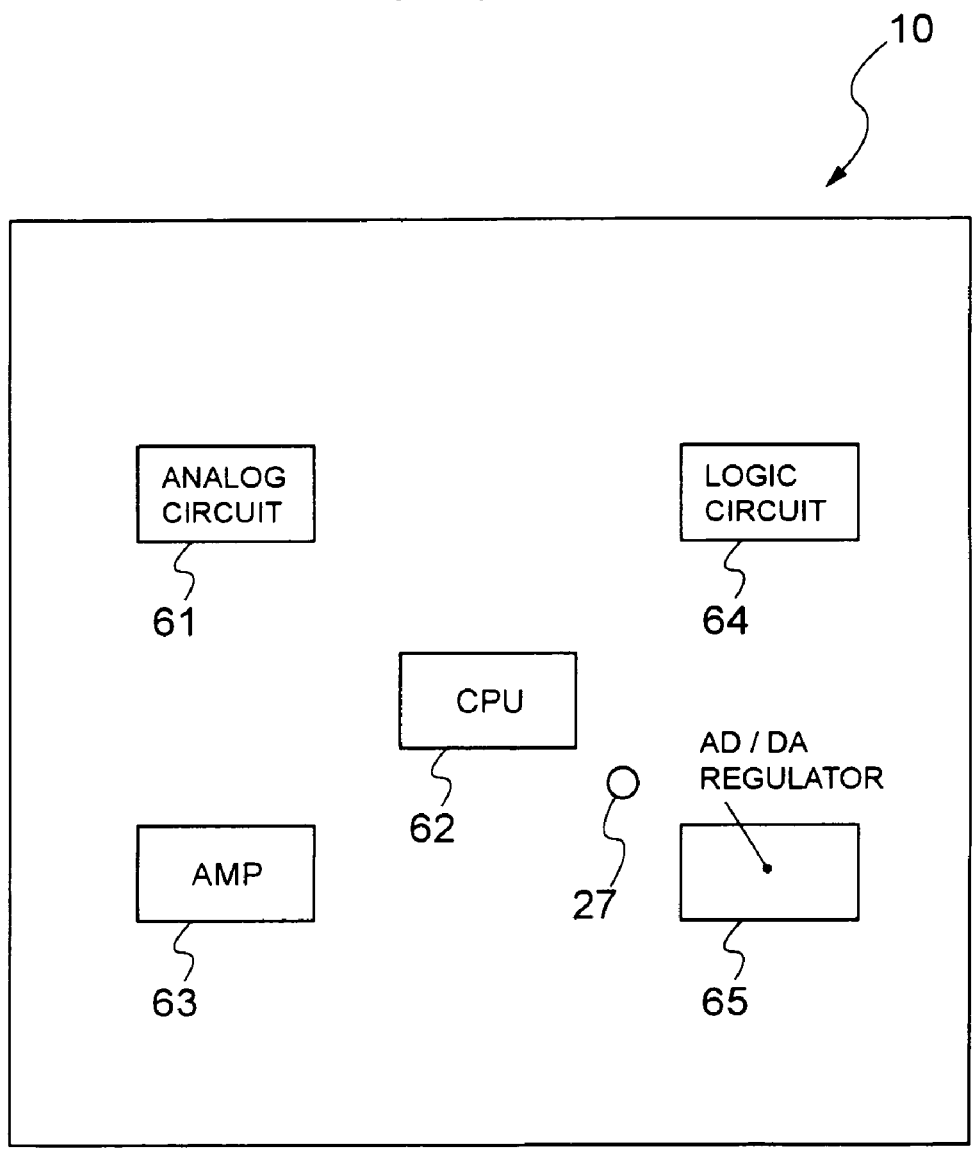
FIG. 6 is a block diagram of a semiconductor device produced according to the first embodiment of the present invention.

As shown in FIG. 6, an analog circuit 61, a CPU 62, an amplifier 63, a logic circuit 64 and an AD/DA regulator 65 are provided on the semiconductor device 10 using conventional technology. The substrate contact 27 is arranged between the AD/DA regulator 65, which is susceptible to instability of the ground potential, and the CPU 62, which is a source of noise.

As a result of arranging the substrate contact 27 at the above-described location, deterioration of the characteristics of the AD/DA regulator 65 caused by instability of the ground potential can be reduced.

As described above, connection status between an external connection pad and a support substrate can be confirmed following completion of the wafer process, and it is possible to prevent PID that would occur during the semiconductor device production process from influencing on internal circuits. Therefore, productivity of the semiconductor device production process can be improved.

Second Embodiment

Figure 7:
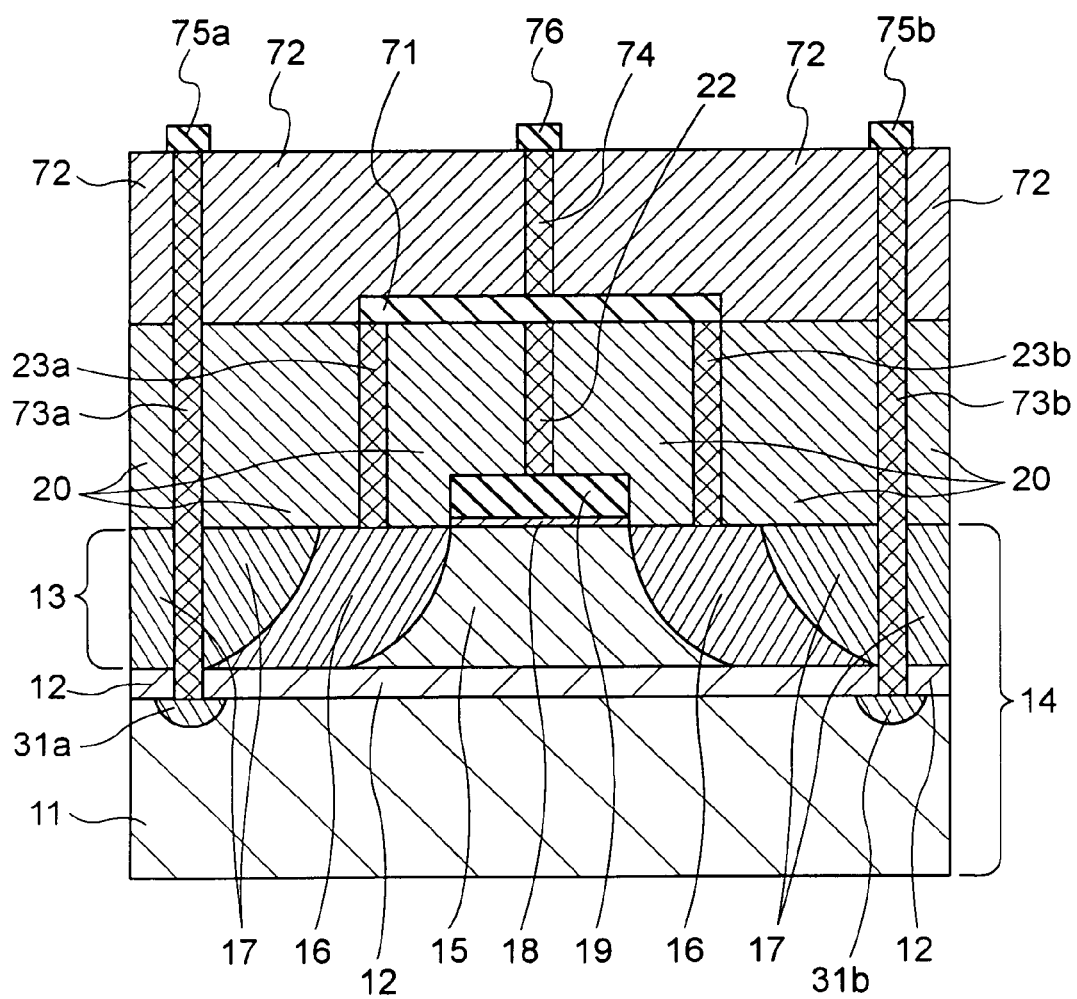
FIG. 7 is a cross-sectional view of a semiconductor device produced according to a second embodiment of the present invention.

Referring to FIG. 7, a semiconductor device produced according to a second embodiment of the present invention will be described. In the first and second embodiment, the same or similar reference numerals and symbols are used to indicate same or similar elements, components, parts and steps.

An explanation of the composition from the support substrate 11 to the first insulating layer 20 is omitted since it is the same as that of the first embodiment.

In the second embodiment, wiring 71 is formed on the first insulating layer 20. The wiring 71 forms a desired circuit by connecting the internal circuit contacts 22, 23a and 23b. A second insulating layer 72 is formed on the wiring 71 and first insulating layer 20. The substrate contacts 73a and 73b that maintain electrical continuity with the support substrate 11 are formed passing through the second insulating layer 72, first insulating layer 20, device isolation region 17 and buried oxide film 12. An internal circuit contact 74 that maintains electrical continuity with the wiring 71 is formed passing through the second insulating layer 72.

External connection pads 75a and 75b and an internal circuit pad 76 are formed on the second insulating layer 72. The external connection pads 75a and 75b are connected to the substrate contacts 73a and 73b. The internal circuit pad 76 is connected to the internal circuit contact 74.

The external connection pads 75a and 75b are connected to the contact implantation regions 31a and 31b by means of the substrate contacts 73a and 73b. Thus, the external connection pads 75a and 75b are able to maintain electrical continuity with the support substrate 11.

Figure 8:
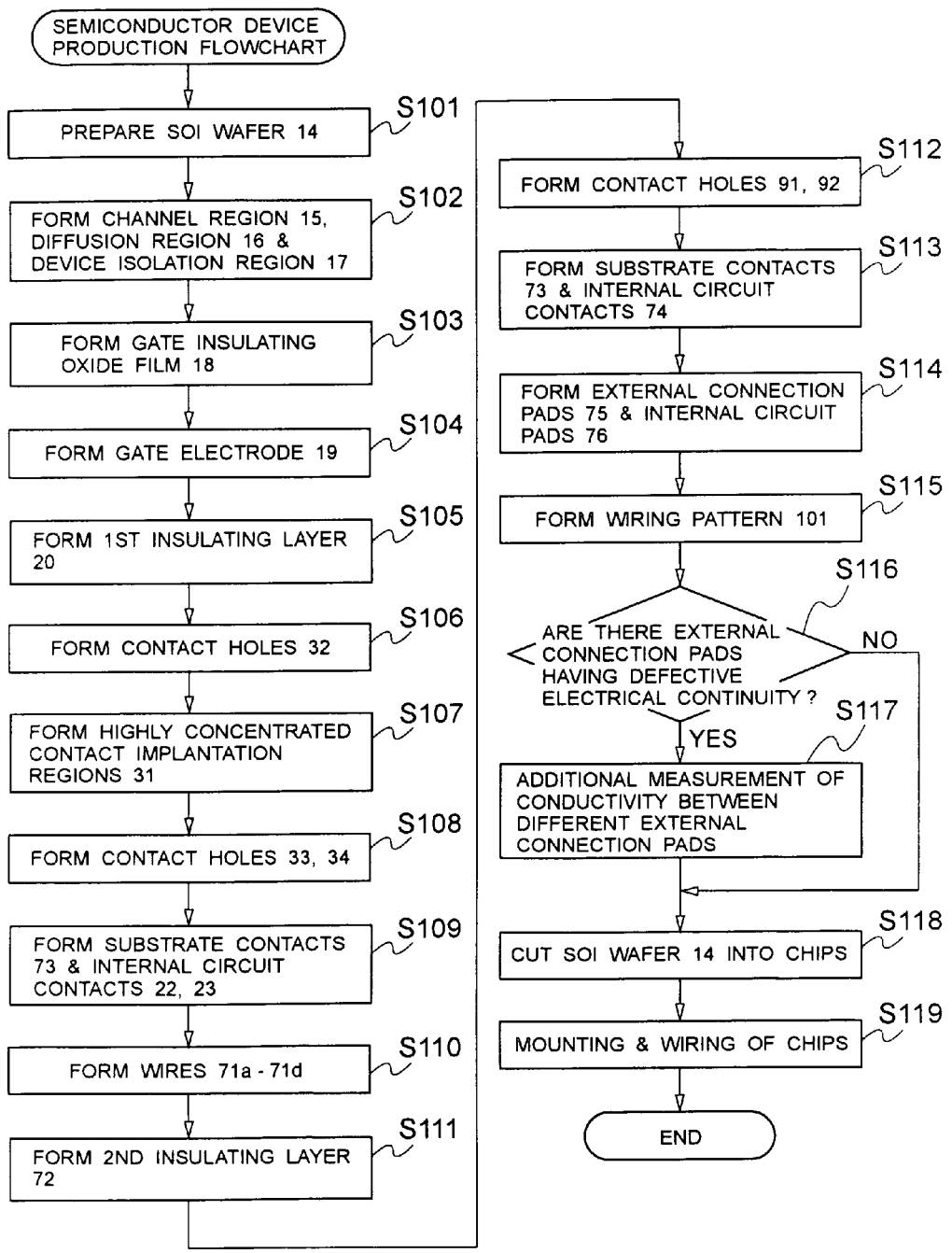
FIG. 8 is a flow chart showing a semiconductor device production process in the second embodiment of the present invention.

A detailed explanation of an exemplary production method for the above-mentioned semiconductor device is provided with reference to FIGS. 8 to 11. Since Steps S101 to S108 in FIG. 8 are the same as Steps S1 to S8 in the production process of the first embodiment, an explanation thereof is omitted.

Figure 9A:
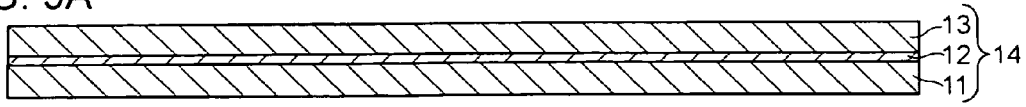
FIG. 9A to FIG. 9G is a series of cross-sectional views of a semiconductor device in the production process of the second embodiment of the present invention.
Figure 9B:
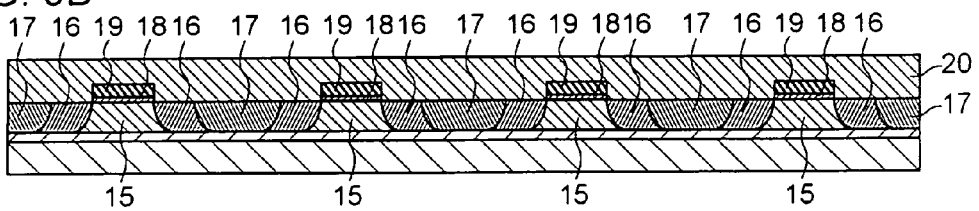
Figure 9C:
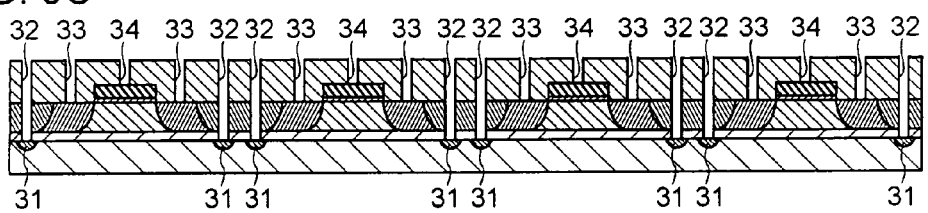
Figure 9D:
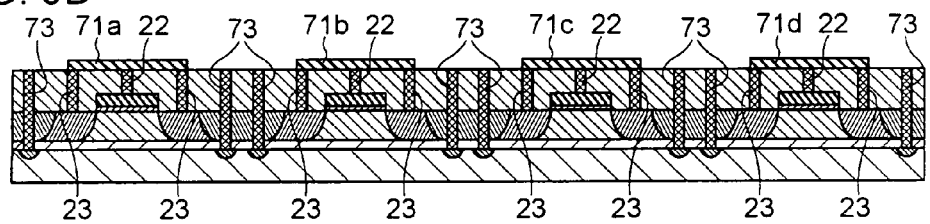

The substrate contacts 73, which maintain electrical continuity with the contact implantation region 31, internal circuit contacts 22, which maintain electrical continuity with gate electrode 19, and internal circuit contacts 23, which maintain electrical continuity with diffusion region 16, are formed in the contact holes 32, 33 and 34 by growing tungsten and the like (Step S109). Excess tungsten may be removed by etching back. Subsequently, a metal film composed of aluminum or aluminum alloy is deposited by sputtering, for example, on the first insulating layer 20, internal circuit contacts 22 and internal circuit contacts 23, and then the metal film is formed in a desired pattern by photolithography to create the wires 71a to 71d (Step S110). The wires 71a to 71d may not be connected to each other (e.g., the wire 71a is not connected to the wire 71b), but may connect the internal circuit contacts 22 to the internal circuit contacts 23. A cross-sectional view of the SOI wafer following formation of the wires 71a to 71d is shown in FIG. 9D.

Figure 9E:
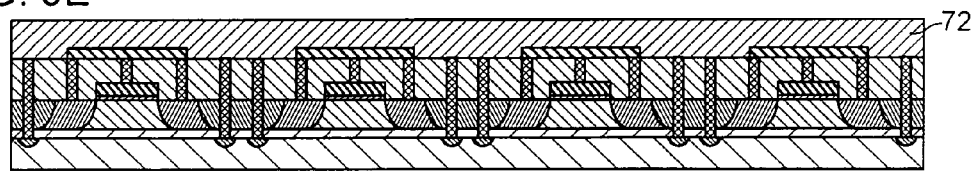

Next, a second insulating layer 72 is formed on the first insulating layer 20 and wires 71a to 71d (Step S111). A cross-sectional view of the SOI wafer following formation of the second insulating layer 72 is shown in FIG. 9E. The second insulating layer 72 may be deposited by chemical vapor deposition (CVD).

Figure 9F:
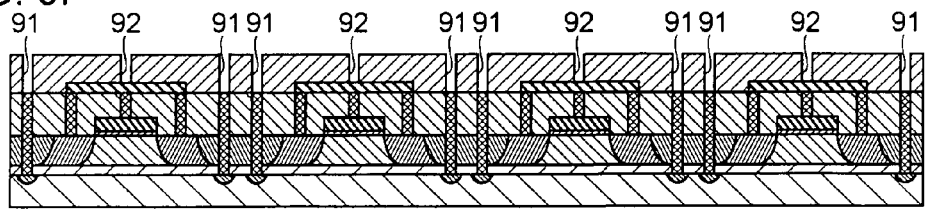

Next, contact holes 91 extending to the substrate contacts 73 and contact holes 92 extending to the wires 71a to 71d are formed according to the same method as that used to form the contact holes 32, 33 and 34 (Step S112). A cross-sectional view of the SOI wafer following formation of the contact holes 91 and 92 is shown in FIG. 9F.

Figure 9G:
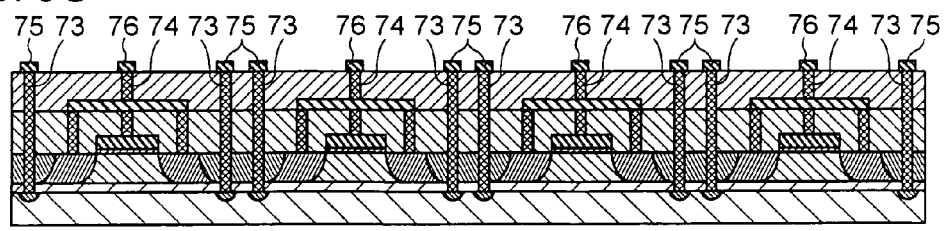

Next, the substrate contacts 73 are formed to the upper surface of the second insulating layer 72 by growing tungsten and the like in the contact holes 91 and 92, and internal circuit contacts 74 are formed in the contact holes 92 (Step S113). Excess tungsten may be removed by etching back. Subsequently, the external connection pads 75 are formed on the second insulating layer 72 and internal circuit pads 76 are formed on the internal circuit contacts 74 (Step S114). Electrical continuity is maintained between the internal circuit pads 76 and internal circuit contacts 74 since the internal circuit pads 76 are formed on the internal circuit contacts 74. It should be noted that the internal circuit pads 76 may be formed on the second insulating layer 72 without being formed on the internal circuit contacts 74. In this case, a wiring step may be provided for connecting the internal circuit pads 76 to the internal circuit contacts 74. A cross-sectional view of the SOI wafer following formation of the external connection pads 75 and internal circuit pads 76 is shown in FIG. 9G.

Figure 10:
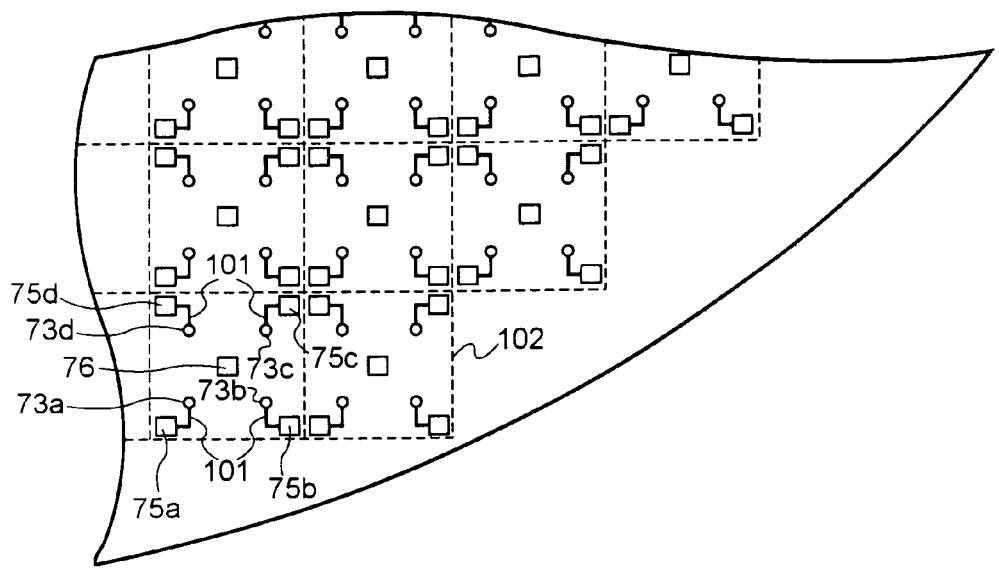
FIG. 10 is similar to FIG. 4 and shows an enlarged view of a portion corresponding to the broken line 4B of FIG. 4A in the second embodiment.

Next, a wiring pattern 101 is formed such that the external connection pads 75 formed on the second insulating layer 72 are not connected to each other, but connected to the corresponding substrate contacts 73 (Step S115). A front view of the SOI wafer following formation of the wiring pattern 101 is shown in FIG. 10. FIG. 10 is similar to FIG. 4B and shows an enlarged view of the SOI wafer 14 of the present embodiment corresponding to the portion indicated with the broken line in FIG. 4A. As shown in FIG. 10, the external connection pad 75a is connected to the substrate contact 73a by means of the wiring pattern 101. The wiring pattern 101 connects each external connection pad 75 to the corresponding substrate contact 73 so that a single external connection pad 75 is paired with a single substrate contact 73. Thus, electrical continuity can be confirmed for each substrate contact by a measurement step (will be described).

Next, the presence of external connection pads having defective electrical continuity is determined by measuring the conductivity between the external connection pads 75 formed on the second insulating layer 72 (Step S116). Each two adjacent external connection pads (e.g., the external connection pad 75a and 75b) make a pair (referred to as "pad pair"), and measurement of conductivity may be carried out for a plurality of pad pairs in parallel. If no pad pairs for which measured conductivity is equal to or less than a reference value (i.e., the state in which electrical continuity is not maintained) are detected, all the external connection pads 75 within the SOI wafer 14 are judged to be connected with the support substrate 11, and the process proceeds to Step S118.

If any pad pair for which measured conductivity is equal to or less than the reference value is detected, an additional measurement of conductivity is carried out (Step S117). This additional measurement of conductivity includes pairing any one of the external connection pads judged to have satisfactory electrical continuity in Step S116 with one of the external connection pads in the defective pad pair, and measuring the conductivity between these external connection pads. This additional measurement of conductivity is carried out for the other external connection pad in the defective pad pair. As a result, it is possible to know which one (or both) of the external connection pads in the pad pair judged to be defective in Step S116 is really defective. Pairing the external connection pads for measurement of conductivity can be easily carried out by a predetermined program. Altering the pairing can also be done easily with common technique. Specific examples of Steps S116 and S117 are omitted since they are the same as those of the first embodiment (see the description related to Step S17).

Next, the SOI wafer is cut into chips by dicing and the like in the same manner as ordinary semiconductor device production processes (Step S118). For example, the SOI wafer is cut into chips by following the broken lines 102.

Since the electrical connection measurement is carried out in Steps S116 and S117 and then the chip cutting is carried out in Step S118, the presence of defective electrical continuity is known upon chip cutting for each chip. Chips having defective electrical continuity can be prevented from proceeding to the next step of the production process by removing those chips having external connection pads with defective electrical continuity.

Figure 11:
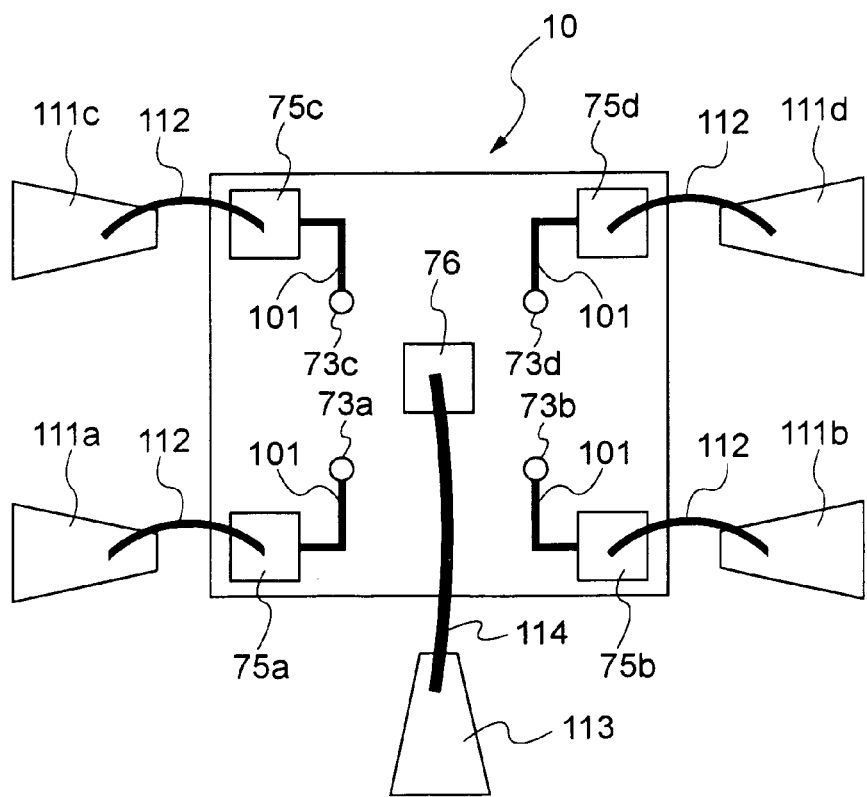
FIG. 11 schematically illustrates wiring of a semiconductor device in the second embodiment of the present invention.

Next, the chips prepared in Step S118 are mounted and wired in a predetermined manner in a mounting area (not shown) of a semiconductor device (Step S119). For example, as shown in FIG. 11, the predetermined wiring may connect the external connection pads 75a to 75d to the external terminals 111a to 111d respectively by wires 112, and connect the internal circuit pad 76 to an external terminal 113 by a wire 114. As a result of this connection, the external connection pads 75a to 75d and internal circuit pad 76 are independently connected to the outside. It should be noted that the external connection pads 75 and internal circuit pad 76 may be connected to the external terminals 111a to 111d and 113 by wire bonding.

Next, an example of the layout of the substrate contacts 73 produced according to the above-described semiconductor device production process is described with reference to FIG. 12.

Figure 12:
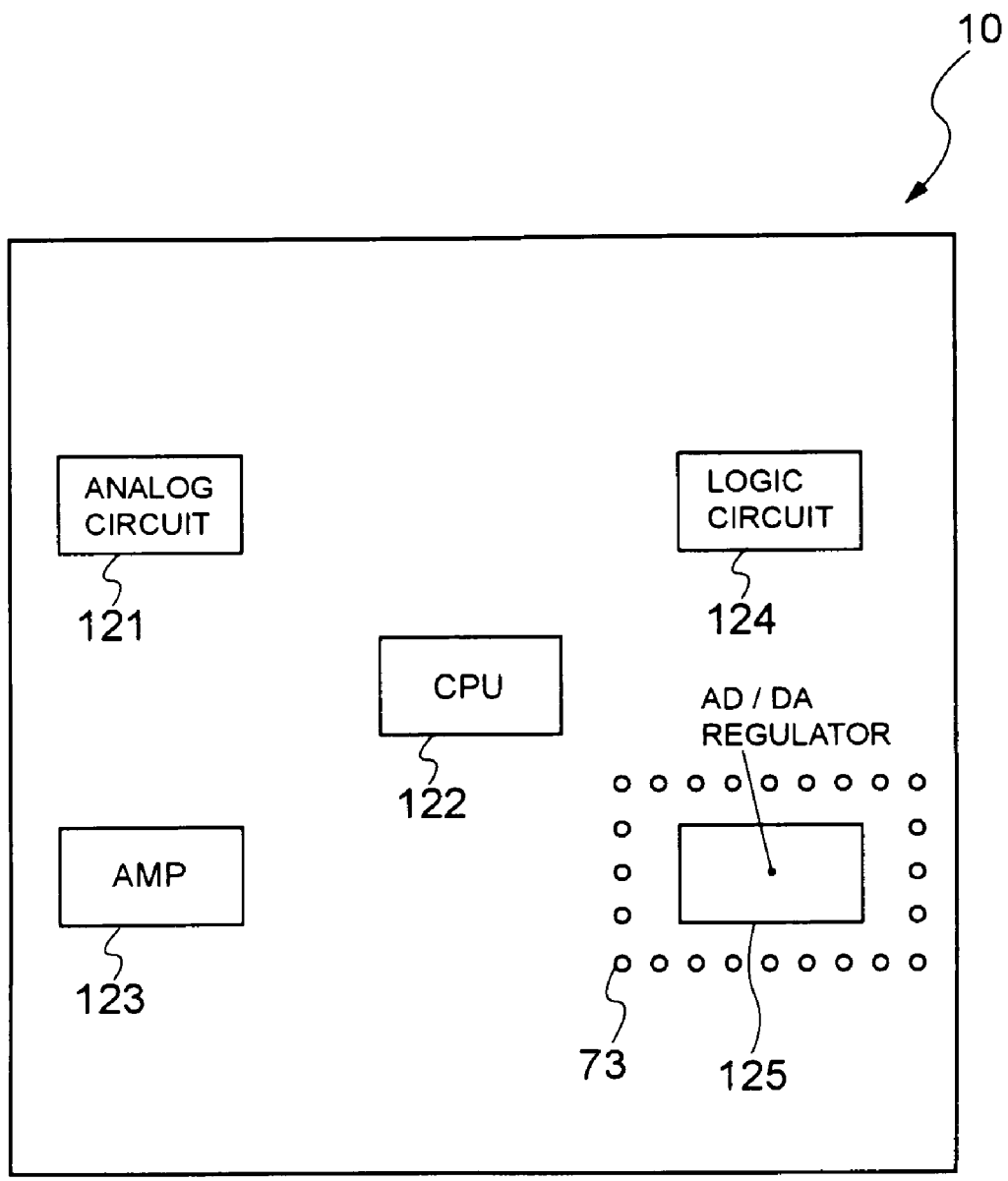
FIG. 12 is a block diagram of a semiconductor device 8. produced according to the second embodiment of the present invention.

As shown in FIG. 12, an analog circuit 121, a CPU 122, an amplifier 123, a logic circuit 124 and an AD/DA regulator 125 are provided on the semiconductor device 10 using conventional technology. A plurality of substrate contacts 73 are arranged so as to surround the AD/DA regulator 125, which is susceptible to instability of the ground potential.

As a result of arranging the substrate contacts 73 at the above-described locations, deterioration of the characteristics of the AD/DA regulator 125 caused by instability of the ground potential can be reduced.

As described above, connection status between a plurality of external connection pads and a support substrate provided on a single semiconductor chip can be confirmed following completion of the wafer process. Therefore, productivity of the semiconductor device production process can be improved while preventing PID occurring during the semiconductor device production process (waferprocess) from having an effect on internal circuits.

Third Embodiment

Figure 13:
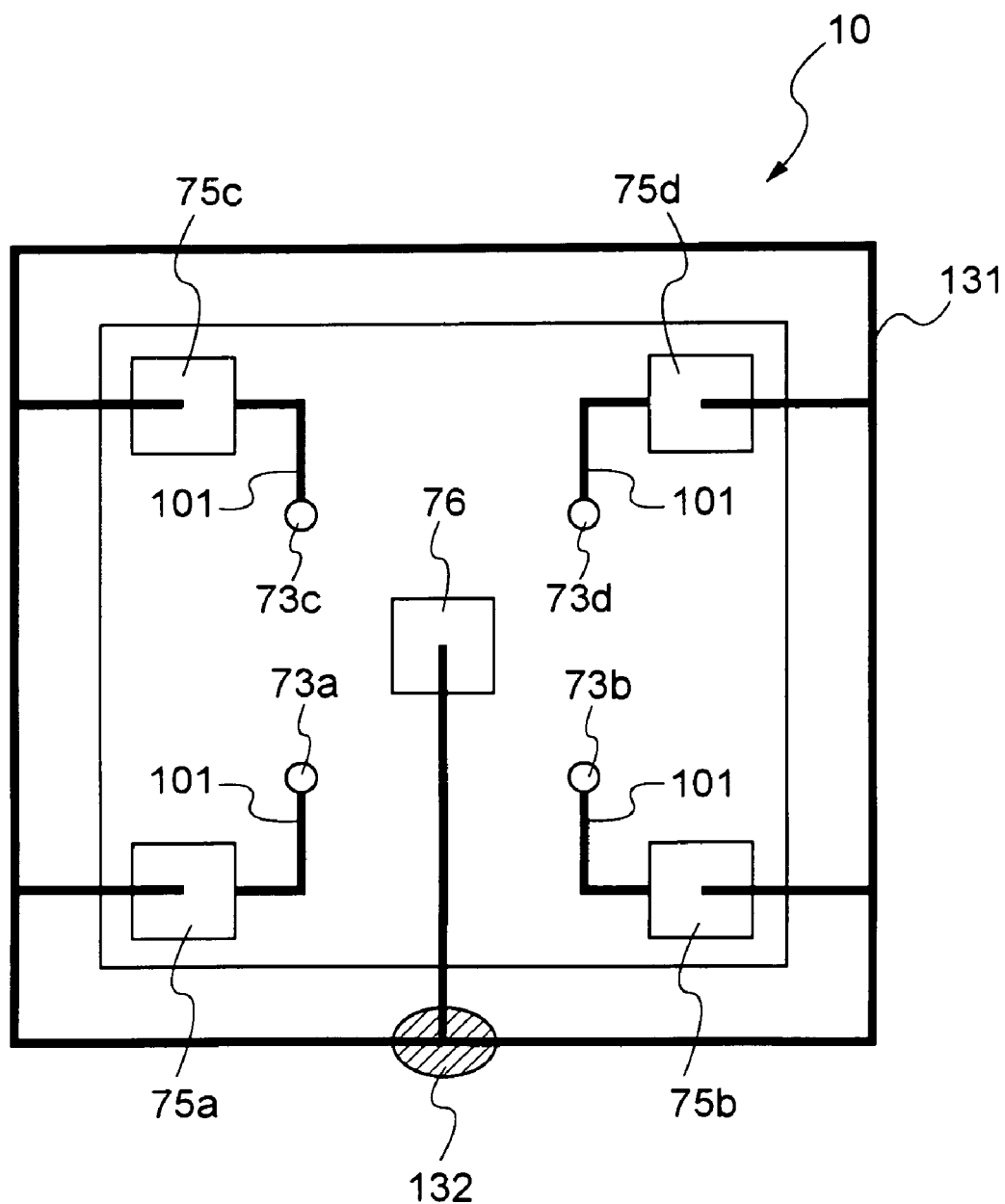
FIG. 13 schematically shows wiring of a semiconductor device in a third embodiment of the present invention.

A modification to the second embodiment will be described as a third embodiment of this invention with reference to FIG. 13. The third embodiment employs Steps S101 to S118 (FIG. 8) of the second embodiment. The wiring in Step S119 is modified in the third embodiment. In this modified step, the external connection pads 75a to 75d and internal circuit pad 76 are connected to an external ground terminal 132 by a rewiring wire 131, as shown in FIG. 13. The rewiring wire may simply be referred to as rewiring. For example, the rewiring 131 includes an under layer (not shown) formed by sputtering and an upper layer (not shown) formed by plating on the under layer. The upper layer is composed mainly of copper. A wiring step for this rewiring wire 131 is hereinafter referred to as a wafer-level chip size package (W-CSP) step. An example of rewiring wire 131 is shown in FIG. 13.

By providing the rewiring 131 as shown in FIG. 13, only a single external ground terminal 132 is required, thereby making it possible to reduce the size and cost of the semiconductor device.

Fourth Embodiment

Figure 14:
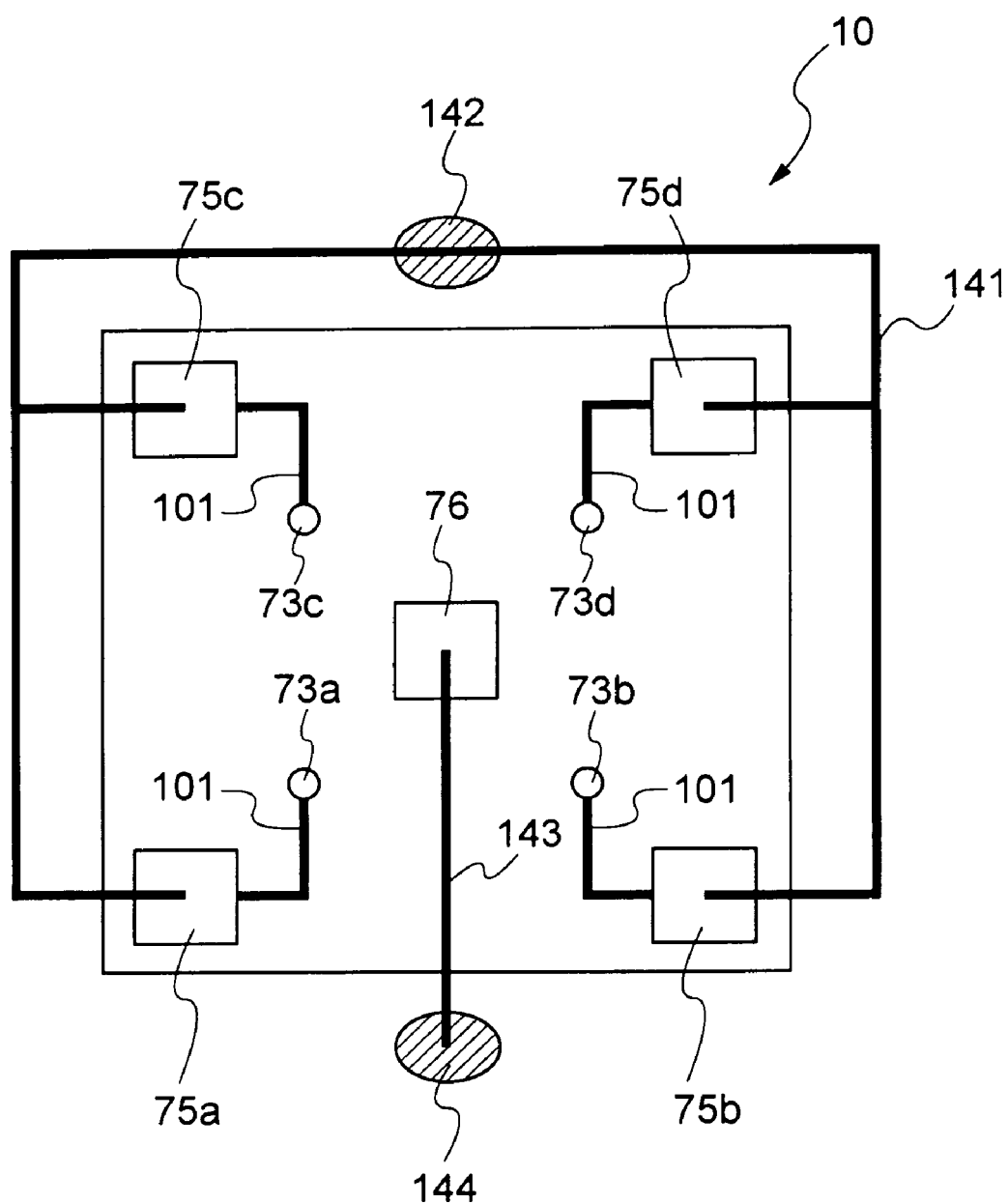
FIG. 14 schematically shows wiring of a semiconductor device in a fourth embodiment of the present invention.

A modification to the third embodiment will be described as a fourth embodiment of this invention with reference to FIG. 14. The W-CSP step of the third embodiment is modified in the fourth embodiment. Specifically, the external connection pads 75a to 75d and internal circuit pad 76 are connected to different external ground terminals, as shown in FIG. 14.

The external connection pads 75a to 75d are connected to an external ground terminal 142 by a rewiring wire 141. The internal circuit pad 76 is connected to another external ground terminal 144 by another rewiring wire 143.

In the fourth embodiment, the external connection pads 75 are not connected to the external ground terminal 144. Therefore, both PID occurring in the wafer process as well as PID occurring in the W-CSP step can be prevented from affecting internal circuits.

This application is based on Japanese Patent Application No. 2007-87400 filed on Mar. 29, 2007, and the entire disclosure thereof is incorporated herein by reference.

What is claimed is:

1. A semiconductor device production process comprising the steps of:
    a preparation step for preparing an SOI wafer that includes a silicon support substrate, an oxide film formed on the silicon support substrate, and a semiconductor layer formed on the oxide film;
    a device formation step for forming a plurality of semiconductor functional devices in the semiconductor layer such that said semiconductor functional devices have an insulation layer on their surfaces, and for forming a plurality of substrate contacts extending to the silicon support substrate through the semiconductor layer and the oxide film such that the plurality of substrate contacts are associated with the plurality of semiconductor functional devices respectively;
    a pad formation step for forming a plurality of external connection pads on the insulation layer such that the plurality of external connection pads are provided for the plurality of semiconductor functional devices respectively;
    a pattern formation step for forming a wiring pattern that connects the substrate contacts to the external connection pads such that the external connection pads are not connected to each other;
    a basic inspection step for measuring conductivity between at least two of said external connection pads; and
    an additional inspection step for replacing one of those external connection pads which have undergone said basic inspection step with another external connection pad and for measuring conductivity between the external connection pads after said replacement, if the conductivity measured in said basic inspection step is equal to or less than a predetermined value.

2. The semiconductor device production process according to claim 1, wherein the device formation step includes forming a wiring circuit, that connects at least two of the substrate contacts, in the insulation layer.

3. The semiconductor device production process according to claim 1, wherein the pattern formation step includes forming a plurality of first wiring patterns such that each said first wiring pattern connects each said external connection pad to the corresponding substrate contact.

4. The semiconductor device production process according to claim 3, further comprising a wiring step for forming a second wiring pattern that connects the plurality of external connection pads to a reference potential terminal following the basic inspection step.

5. The semiconductor device production process according to claim 3, further comprising a wiring step for forming a second wiring pattern that connects the plurality of external connection pads to a reference potential terminal following the additional inspection step.

6. The semiconductor device production process according to claim 4, wherein said wiring step includes connecting the plurality of semiconductor functional devices to the plurality of external connection pads.

7. The semiconductor device production process according to claim 5, wherein said wiring step includes connecting the plurality of semiconductor functional devices to the plurality of external connection pads.

8. The semiconductor device production process according to claim 6, wherein said reference potential terminal is a ground terminal.

9. The semiconductor device production process according to claim 7, wherein said reference potential terminal is a ground terminal.

10. The semiconductor device production process according to claim 1, wherein said another external connection pad has conductivity equal to or greater than said predetermined value.

11. The semiconductor device production process according to claim 1, wherein said basic inspection step includes making a plurality of external connection pad pairs, and measuring the conductivity between two external connection pads in each said external connection pad pair.

* * * * *